United States Patent [19]

Conolly

[11] Patent Number: 4,760,336
[45] Date of Patent: Jul. 26, 1988

[54] VARIABLE RATE MAGNETIC RESONANCE SELECTIVE EXCITATION FOR REDUCING RF POWER AND SPECIFIC ABSORPTION RATE

[75] Inventor: Steven M. Conolly, Stanford, Calif.
[73] Assignee: Stanford University, Stanford, Calif.
[21] Appl. No.: 19,584
[22] Filed: Feb. 27, 1987
[51] Int. Cl.[4] .................................................. G01R 33/20
[52] U.S. Cl. ..................................... 324/309; 324/313
[58] Field of Search ............... 324/300, 307, 313, 311, 324/314, 318, 319, 320, 322

[56] References Cited

U.S. PATENT DOCUMENTS

| | | | |
|---|---|---|---|
| 4,471,306 | 9/1984 | Edelstein | 324/311 |
| 4,480,228 | 10/1984 | Bottomley | 324/307 |
| 4,506,223 | 3/1985 | Bottomley et al. | 324/307 |
| 4,568,880 | 2/1986 | Sugimoto | 324/309 |
| 4,585,993 | 4/1986 | Bottomley | 324/309 |
| 4,593,247 | 6/1986 | Glover | 324/309 |
| 4,613,949 | 9/1986 | Glover et al. | 324/309 |

Primary Examiner—Michael J. Tokar
Attorney, Agent, or Firm—Flehr, Hohbach, Test, Albritton & Herbert

[57] ABSTRACT

In magnetic resonance imaging where a subject is placed in a static field and the subject is selectively excited by applying an RF magnetic field in the presence of a gradient magnetic field, the peak RF power of the RF magnetic field is reduced by decreasing the peak amplitude of the RF magnetic field while concurrently reducing the magnitude of the gradient magnetic field. The incremental time duration for the RF magnetic field portion which is reduced in amplitude is proportionately increased. In using an RF pulse having front and back sidelobes with a positive lobe therebetween, the duration of the RF pulse can be reduced by increasing the magnitudes of the sidelobes and concurrently reducing the time periods of the sidelobes. A minimum SAR embodiment can be realized.

8 Claims, 3 Drawing Sheets

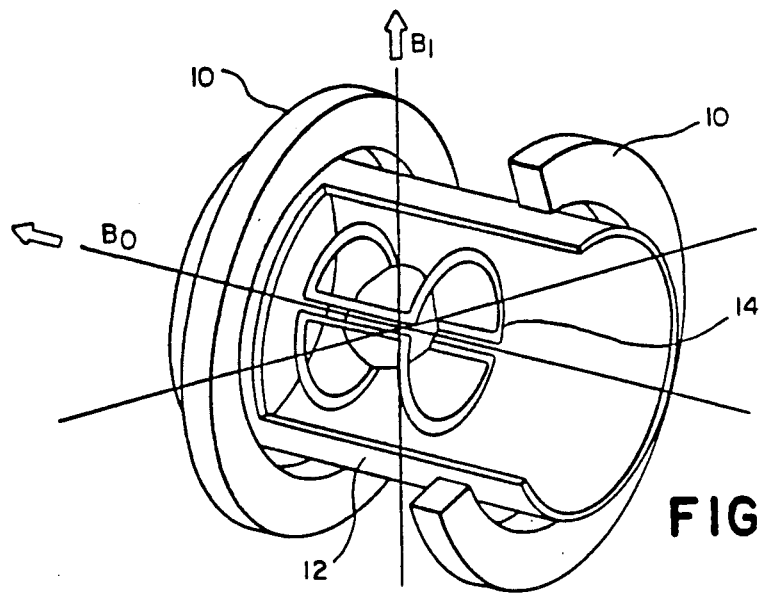
FIG.—1A
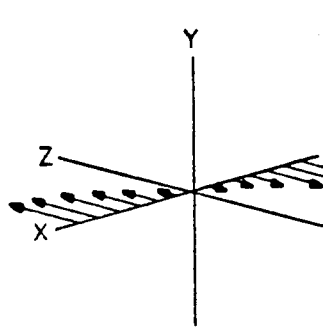
FIG.—1B
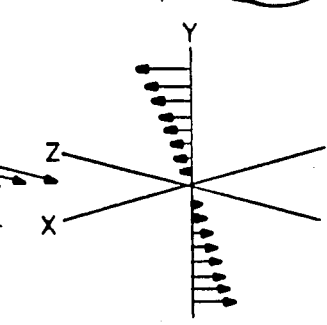
FIG.—1C
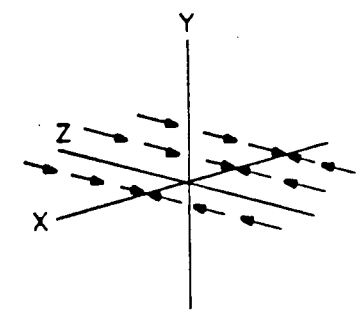
FIG.—1D
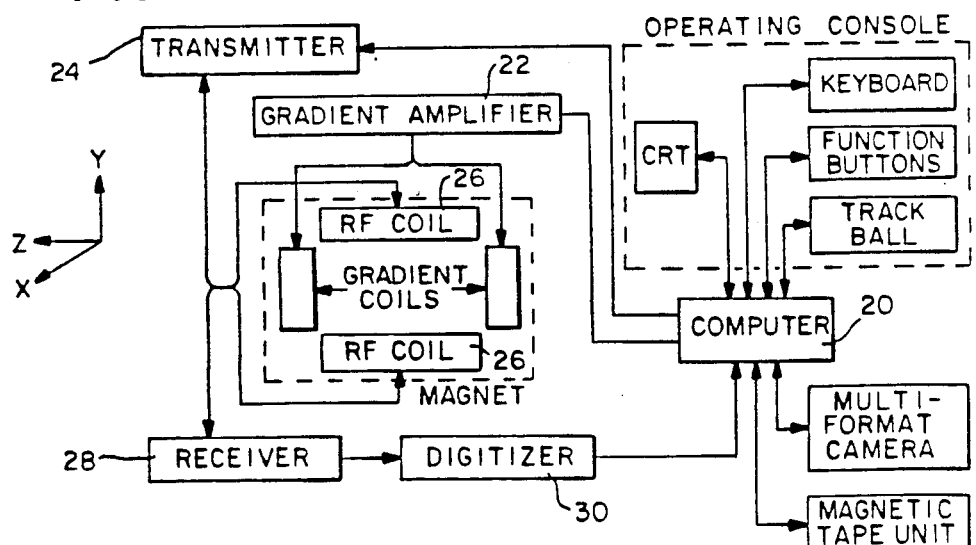
FIG.—2

VARIABLE RATE MAGNETIC RESONANCE SELECTIVE EXCITATION FOR REDUCING RF POWER AND SPECIFIC ABSORPTION RATE

BACKGROUND OF THE INVENTION

This invention relates generally to magnetic resonance imaging, and more particularly the invention relates to improved selective excitation for imaging by varying the excitation rate.

Nuclear magnetic resonance (NMR) imaging, also called magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

A descriptive series of papers on NMR appeared in the June 1980 issue of the *IEEE Transactions on Nuclear Science*, Vol. NS-27, pp. 1220-1255. The basic concepts are described in the lead article, "Introduction to the Principles of NMR," by W. V. House, pp. 1220-1226, which employ computed tomography reconstruction concepts for reconstructing cross-sectional images. A number of two- and three-dimensional imaging methods are described. Medical applications of NMR are discussed by Pykett in "NMR Imaging in Medicine," *Scientific American*, May 1982, pp.78-88, and by Mansfield and Morris, *NMR Imaging in Biomedicine*, Academic Press, 1982.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency, $\omega_o$, of the precession of the nuclei is the product of the magnetic field, $B_o$, and the so-called magnetogyric ratio, $\gamma$, a fundamental physical constant for each nuclear species:

$$\omega_o = B_o \cdot \gamma$$

Accordingly, by superimposing a linear gradient field, $B_z = z \cdot G_z$, on the static uniform field, $B_o$, which defines the Z axis, for exmaple, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclei spin flip in response to an RF pulse excitation is proportional to the integral of the pulse over time.

In applying the RF magnetic pulse, the specific absorption ratio (SAR) of the excited tissue is proportional to integrated RF power and the peak RF power is proportional to the square of the RF amplitude. SAR may eventually become a limiting consideration in high-speed imaging. Peak power limitations sometimes restrict the number of sinc sidelobes one can fit in a specified interval. Furthermore, optimal control pulses, hyperbolic secant pulses, and pulses insensitive to RF inhomogeneity all demand higher peak amplitudes than conventional sinc pulses. Hence, given a choice of two facsimile pulses, that is, two RF/gradient waveform pairs with identical spatial selectivity, preference is given to the lower-amplitude RF facsimile pulse if the duration penalty is not excessive.

Conventionally, pulse refabrication relies on uniform rate-reduction. For example, one could quarter both the RF and gradient amplitudes while quadrupling the duration. However, the new pulse might become too long for use in imaging short spin-spin relaxation time ($T_2$) species. Windowing the new pulse to the original duration obviates the penalty in duration but severely degrades the steepness of the slice profile.

SUMMARY OF THE INVENTION

An object of the present invention is a method and means for reducing RF power and peak amplitude for a desired flip angle without any significant increase in the time duration for the RF pulse.

Another object of the invention is a method of RF excitation in which the peak amplitude of the RF pulse is reduced with no slice degradation and with a minimal increase in pulse duration.

Still another object of the invention is a method of smooth variation of the gradient waveform for parametric minimization of the RF power.

Yet another object of the invention is a method for selecting a desired slice with minimum SAR deposited in the body.

A feature of the invention is the variation of the RF excitation amplitude inversely proportional to variation of the incremental pulse duration for the portions of the RF pulse during which amplitude is varied.

In a specific embodiment, in applying a pulse of RF excitation, a peak of the applied pulse is reduced in amplitude and the duration of the reduced portion of the pulse is increased. Sidelobes of the pulse along with the lower amplitude portions of the main pulse need not be affected and the durations thereof are not changed. Thus, by reducing only a limited portion of the main pulse amplitude, and increasing the duration only of the reduced amplitude portion, the power is reduced without a large increase in total duration of the pulse.

In accordance with a feature of the invention, the total pulse time duration can be reduced by increasing the amplitudes of the sidelobes and the lower amplitude portions of the main pulse while shortening time durations thereof. Accordingly, a net reduction in total pulse time can be realized while reducing peak amplitude and RF power.

The invention and objects and features thereof will be more readily apparent from the following detailed description and appended claims when taken with the drawing.

DESCRIPTION OF THE DRAWING

FIGS. 1A-1D illustrate the arrangement of MRI apparatus and magnetic fields generated therein.

FIG. 2 is a functional block diagram of MRI imaging apparatus.

DETAILED DESCRIPTION OF THE ILLUSTRATIVE EMBODIMENTS

Figure 3:
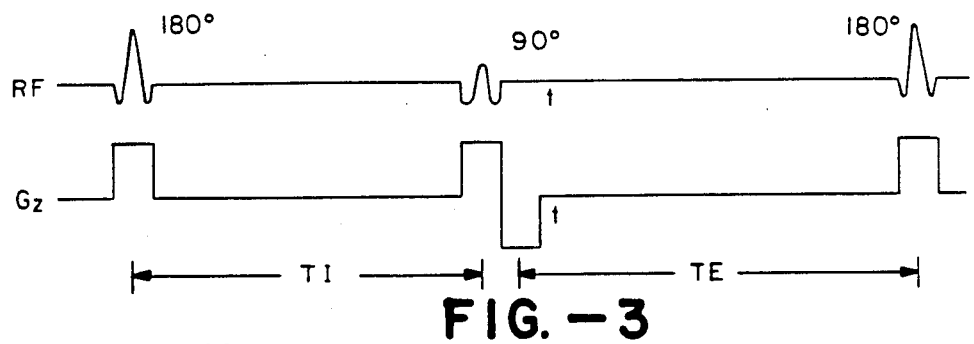
FIG. 3 illustrates a basic pulse sequence for exciting a slab for projection image.

Referring now to the drawings, FIG. 1A is a perspective view partially in section illustrating coil apparatus in NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," *Proceedings of the IEEE*, Vol. 71, No. 3, March 1983, pp. 338–350. Briefly, the uniform static field $B_o$ is generated by the magnet comprising the coil pair 10. A gradient field $G(x)$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_o$ and varies linearly with distance along the X axis but does not vary with distance along the Y or Z axes. FIGS. 1C and 1D are similar representations of the Y gradient and Z gradient fields, respectively.

FIG. 2 is a functional block diagram of the imaging apparatus as disclosed in *NMR - A Perspective on Imaging*, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

FIG. 3 is a graph illustrating applied RF pulses for a 180° flip angle and a 90° flip angle followed by a "time reversal" 180° pulse and the associated Z axis magnetic field gradient applied during application of the RF pulses. The illustrated pulses are conventional sinc pulses which have front and back lobes with a main RF pulse therebetween. From this representation, it can be seen that the angle of flip is proportional to the area under the pulse.

In accordance with the present invention, the peak amplitude of the selective excitation pulse is reduced to produce a variable-rate pulse without adversely affecting the steepness of the slice profile. The time period for applying the variable rate pulse may be increased by a minimal amount when only the peak amplitude of the selective pulse is reduced, and the pulse duration can actually be reduced by changing the amplitudes not only of the peak portion but also of the front and back lobes and the lower amplitude portion of the main pulse.

Figure 4:
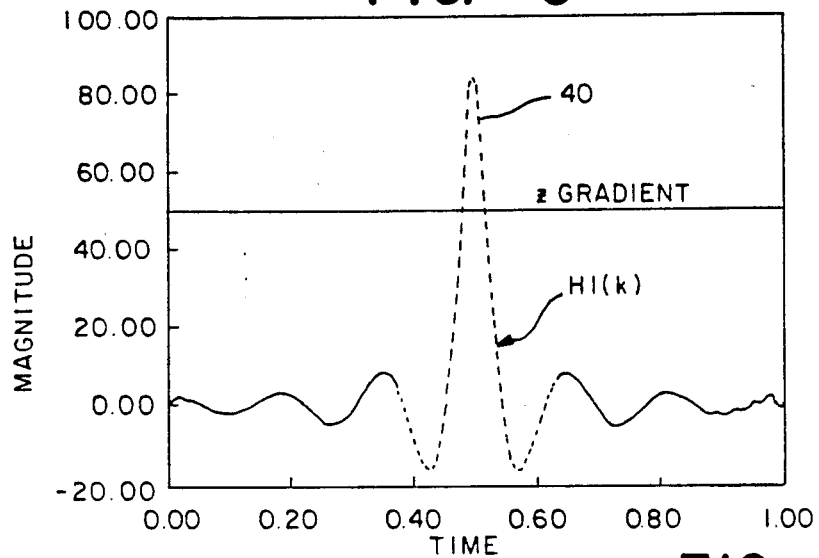
FIG. 4 is a plot of pulse shape and duration and gradient for a conventional constant rate pulse.
Figure 5:
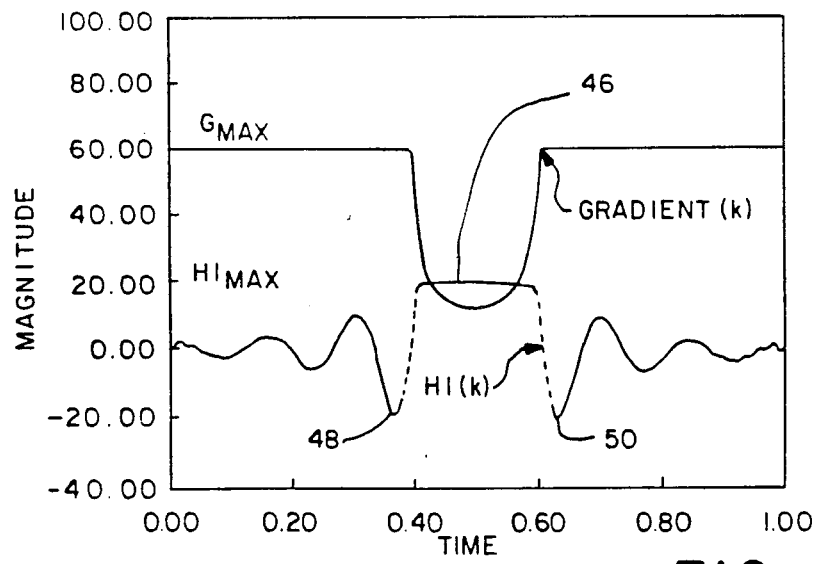
FIG. 5 is a plot of pulse amplitude and duration along with gradient amplitude for variable-rate pulse in accordance with the invention.

FIG. 4 illustrates a constant rate-pulse 40 and the gradient applied during application of the pulse. The time duration of the pulse is denoted along with the relative amplitude thereof. The amplitude and time are arbitrary units but on the same scale as FIG. 5. In FIG. 5, a variable-rate pulse 44 is illustrated in which the peak 46 of the pulse is reduced by a factor of 4 and the time duration of the reduced peak portion is increased by the same factor. The reduction in peak amplitude of the selective excitation pulse must be accompanied by a reduction in the magnetic field gradient, G, applied during that interval of the RF pulse application to maintain the desired slice selection.

In the embodiment shown in FIG. 5, not only is the peak amplitude 46 reduced, but the amplitudes of the sidelobes 48 and 50 are increased along with a concomitant decrease in the time period for applying the sidelobes. Thus, a net decrease in total pulse duration is realized while the peak amplitude has been quartered. It will be noted that the maximum magnetic field gradient, $G_{max}$, is increased from approximately 50.00 to approximately 60.00 where the sidelobes are increased.

In the embodiments of FIGS. 4 and 5, assume that H1(k) represents the samples of the RF waveform. Assume also that the maximum deliverable RF amplitude is $H1_{max}$. A dimensionless rate variable, $r(k)$, is defined by $H1(k) = r(k)\, H1_{max}$. Assuming for simplicity that H1(k) is greater than 0, then analysis of the Bloch equation shows that an excitation sample lasting $r(k)\,\Delta t$ with the RF and gradient amplitudes decreased by a factor $r(k)$ will elicit a response identical to the original excitation sample. It can be shown that the minimal duration facsimile pulse must always have either the gradient or the RF at its maximum value. FIG. 4 depicts a constant rate pulse and gradient pair, and the minimal duration facsimile pair is shown in FIG. 5. Only the center of the pulse in FIG. 4 has been slowed down, whereas the other sections have been expedited for a net decrease in pulse duration while the peak amplitude has been quartered. The computed variable-rate pulse and gradient need to be interpolated to a uniformly sampled version for use by the RF and gradient amplifiers in the imaging system. This does not change the timing of the pulses if the new sampling is done finely enough.

Figure 6:
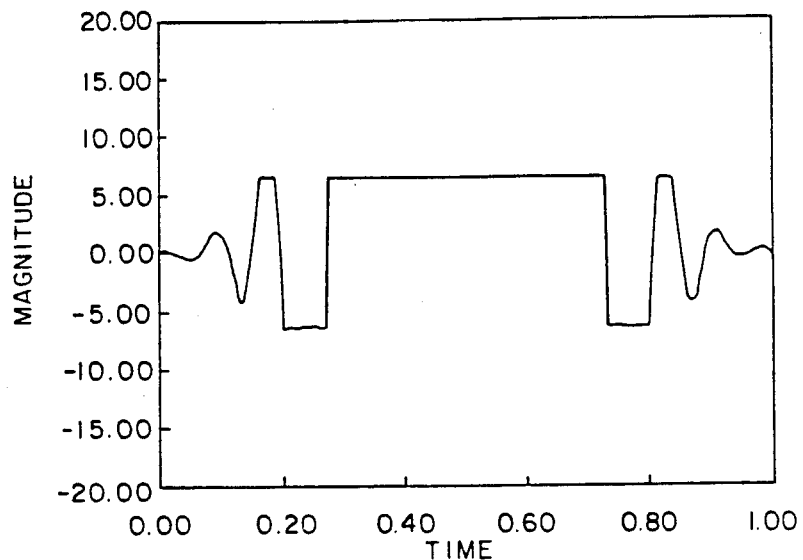
FIG. 6 is a plot of pulse shape and duration for a minimum SAR RF pulse.
Figure 7:
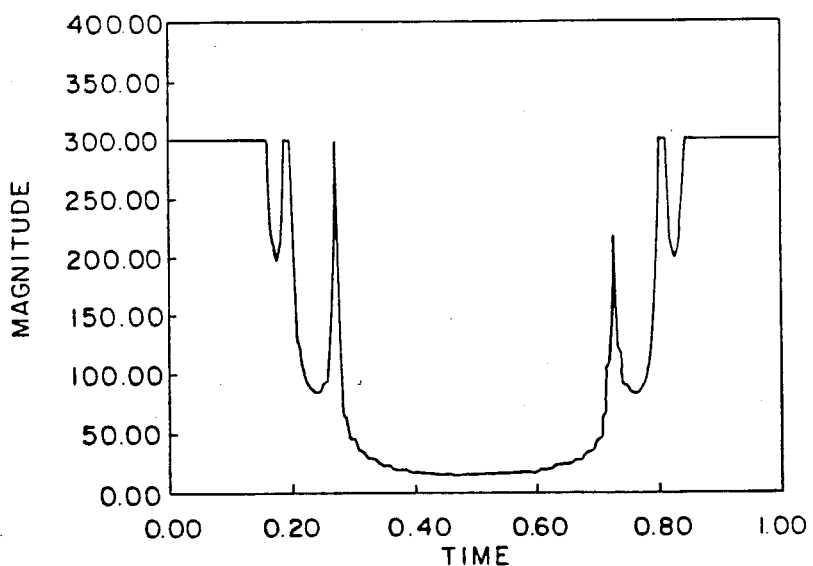
FIG. 7 is a plot of the RF gradient for the minimum SAR RF pulse of FIG. 6.

FIGS. 6 and 7 illustrate the RF pulse shape and RF gradient for a minimum SR excitation using the variable-rate concept. Without gradient waveform constraints, the minimum RF power pulse would have constant magnitude. Since gradient amplifiers do have slew-rate constraints and power constraints, the minimum power pulse in a constrained time does not achieve a constant magnitude pulse. Therefore, the minimum SAR pulse will have a constant magnitude so long as the instantaneous slew-rate and amplitude of the gradient waveform do not violate their constraints. To avoid constraint violation the magnitude of the RF pulse will fall below the constant for small time increments.

There has been described a variable rate NMR selective excitation in which the RF power of the excitation pulse is reduced without degrading the steepness of the slice profile or significantly increasing the duration of the selective excitation pulse. While the invention has been described with reference to two specific embodiments, the description is illustrative of the invention and is not to be construed as limiting the invention. For example, the same concepts can be applied to complex valued RF waveforms such as the hyperbolic secant pulse and can be applied to a smooth parametric variation of the amplitude of the gradient waveform. Various modifications and applications may occur to those skilled in the art without departing from the true spirit and scope of the invention as defined by the appended claims.

What is claimed is:

1. For use in magnetic resonance imaging in which a subject is placed in a static magnetic field, a method of selectively exciting a portion of the subject comprising the steps of
   applying a gradient magnetic field superimposed on said static magnetic field,
   concurrently applying an RF magnetic field to the subject, said RF magnetic field having a peak amplitude,
   reducing the peak amplitude portion of said RF magnetic field and the magnitude of said gradient magnetic field during said peak magnitude portion, and
   increasing the incremental time duration of said RF magnetic field for the reduced peak amplitude portion.

2. The method as defined by claim 1 wherein said RF magnetic field is applied as a pulse having front and back sidelobes and a positive lobe therebetween, said peak amplitude portion occurring in said positive lobe.

3. The method as defined by claim 2 and further including the steps of increasing magnitudes of portions of said sidelobes, increasing the magnitude of said gradient magnetic field during said portions of said sidelobes, and decreasing the incremental time duration of said portions of said sidelobes.

4. The method as defined by claim 3 wherein said step of increasing magnitudes of portions of said sidelobes is limited by the slew-rate and peak magnitude of said gradient magnetic field whereby specific absorption rate (SAR) of the subject is minimized.

5. A method of RF magnetic pulse refabrication for selective excitation in magnetic resonance imaging where an RF magnetic field is applied in the presence of a gradient magnetic field, comprising the steps of
   defining an RF pulse waveform with samples thereof being $H_1(k)$, and a maximum RF amplifier amplitude of $H_1(max)$,
   defining a dimensionless variable $r(k)$ as the ratio $H_{1(k)}/H_1(max)$,
   establishing a reduced amplitude pulse $h(k)$ by the steps of
      reducing the magnitude of said RF pulse by the factor $r(k)$ to form $h(k)$ around the maximum amplitude,
      concurrently reducing the magnitude of said magnetic field gradient by said factor $r(k)$, and
      concurrently increasing the incremental time intervals by said factor $r(k)$ for said RF pulse while the magnitude is reduced.

6. The method as defined by claim 5 wherein said RF pulse waveform is an RF pulse having front and back lobes and a positive lobe therebetween.

7. The method as defined by claim 6 and further including the steps of increasing the amplitudes of said sidelobes while concurrently increasing the magnitude of said gradient magnetic field, and reducing the incremental time duration of the increased amplitude sidelobes.

8. The method as defined by claim 7 wherein said step of increasing magnitudes of portions of said sidelobes is limited by the slew-rate and peak magnitude of said gradient magnetic field whereby specific absorption rate (SAR) of the subject is minimized.

* * * * *